United States Patent
Violette (10) Patent No.: US 7,508,514 B2
(45) Date of Patent: Mar. 24, 2009

(54) CORRECTION OF OFF-AXIS TRANSLATION OF OPTICAL ELEMENTS IN AN OPTICAL ZOOM ASSEMBLY

(75) Inventor: Kevin J. Violette, Woodbury, CT (US)

(73) Assignee: ASML Holding N.V., Veldhoven (NL)

( * ) Notice: Subject to any disclaimer, the term of this patent is extended or adjusted under 35 U.S.C. 154(b) by 355 days.

(21) Appl. No.: 11/473,114

(22) Filed: Jun. 23, 2006

(65) Prior Publication Data

US 2007/0296974 A1   Dec. 27, 2007

(51) Int. Cl.
*G01B 11/00* (2006.01)
(52) U.S. Cl. ............... 356/400; 356/399; 356/139.04; 356/152.2; 356/152.3
(58) Field of Classification Search ........... 356/399, 356/400, 1, 152, 152.2, 139.04, 139.1; 250/206.2, 250/208.2, 214.1, 559.3
See application file for complete search history.

(56) References Cited

U.S. PATENT DOCUMENTS

| 3,723,013 | A  | 3/1973 | Stirland et al. |
| 6,023,337 | A  | 2/2000 | Schiff |
| 6,900,946 | B2 | 5/2005 | Koehler |
| 2005/0007677 | A1 | 1/2005 | Coston et al. |

FOREIGN PATENT DOCUMENTS

| EP | 1 014 196 A2 | 6/2000 |
| EP | 1 672 431 A1 | 6/2006 |
| JP | 11-297611 A | 10/1999 |
| JP | 2000-19385 A | 1/2000 |
| WO | WO 01/14827 A1 | 3/2001 |

OTHER PUBLICATIONS

European Search Report for Application No. 07252391.3-2222, completed Nov. 14, 2007, 13 pages.
Partial European Search Report for European Application No. 07252391.3-2222, mailed Aug. 27, 2007, six (6) pages.

*Primary Examiner*—L. G. Lauchman
(74) *Attorney, Agent, or Firm*—Sterne, Kessler, Goldstein & Fox P.L.L.C.

(57) ABSTRACT

A laser beam may be used to provide a virtual reference axis of travel for the in-axis direction of motion of lenses in a zoom assembly to be positioned during a zoom operation. The virtual reference axis is projected along the optical axis, parallel to existing mechanical lens slides. The virtual reference axis passes through an aperture on each of the lens assemblies, and is sampled by a set of optics and detectors on each of the lens assemblies. The optics and detectors are arranged such that any change in the position of a lens cell within a lens assembly relative to the virtual reference axis is sensed and corrected using a feedback signal to a positioning motor. Since the same virtual reference axis is used for each lens in the zoom assembly, each lens can be independently corrected for off-axis position errors to very high precision.

22 Claims, 10 Drawing Sheets

CORRECTION OF OFF-AXIS TRANSLATION OF OPTICAL ELEMENTS IN AN OPTICAL ZOOM ASSEMBLY

BACKGROUND OF THE INVENTION

1. Field of the Invention

The present invention relates to alignment of optical elements, particularly in an optical lithography system.

2. Background Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Zoom assemblies having movable optical elements are often used in these lithography systems. In the typical zoom assembly, two or more lenses are driven by motors and/or actuators on a screw drive or other arrangement. The lenses are attached to the motor drive on a lens mount assembly. The lenses are translated along the optical axis such that the distance between the lenses can be manipulated according to the desired zoom characteristics of the lithography platform. This implementation supports continuous zoom functionality. An example optical zoom assembly for a mask-based lithography system is described in U.S. Pat. No. 6,900,946, which is hereby incorporated by reference in its entirety.

In the current mask-based systems, when the zoom setting needs to be changed on the system, the lens positions are translated along the optical axis (e.g., Z). This changes the position of each lens relative to each other. In current zoom design, the lens slide or screw drive arrangement provides a fixed or static reference for the off-axis lens position. During translation, the off-axis position (e.g., X, Y, Rz) of the individual lens elements is subject to changes due to imperfections in travel flatness of the lens slide or screw drive. An example off-axis position change range for the X and Y axes is approximately 3 to 50 microns, with an example off-axis position range for Rz being approximately +/−12 arc-seconds.

For current mask-based systems, these relatively minor off-axis motions are easily accounted for in the error budget for the system. However, for optical maskless lithography systems, the projection optic magnification is approximately 100 times greater than for the mask-based system. Thus, these minor translations of the lens position in the illuminator are intolerable for this system. What is needed is a system for reducing the off-axis position motion to a value that may be tolerated by an optical maskless lithography system.

BRIEF SUMMARY OF THE INVENTION

A mechanically stabilized laser beam may be used to provide a virtual reference axis of travel for the in-axis direction of motion of lenses in a zoom assembly to be positioned during a zoom operation. The virtual reference axis is projected along the optical axis, parallel to existing mechanical lens slides. The virtual reference axis passes through an aperture on each of the lens assemblies, and is sampled by a set of optics and detectors on each of the lens assemblies.

The optics and detectors are arranged such that any change in the position of a lens cell within a lens assembly relative to the virtual reference axis is sensed and corrected using a feedback signal to a positioning motor. Since the same virtual reference axis is used for each lens in the zoom assembly, each lens can be independently corrected for off-axis position errors to very high precision. Thus, the correct optical relationship between the lens elements is preserved.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION OF THE INVENTION

I. Introduction

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to effect such feature, structure, or characteristic in connection with other embodiments whether or not explicitly described.

II. Lithography System Overview

Figure 1:
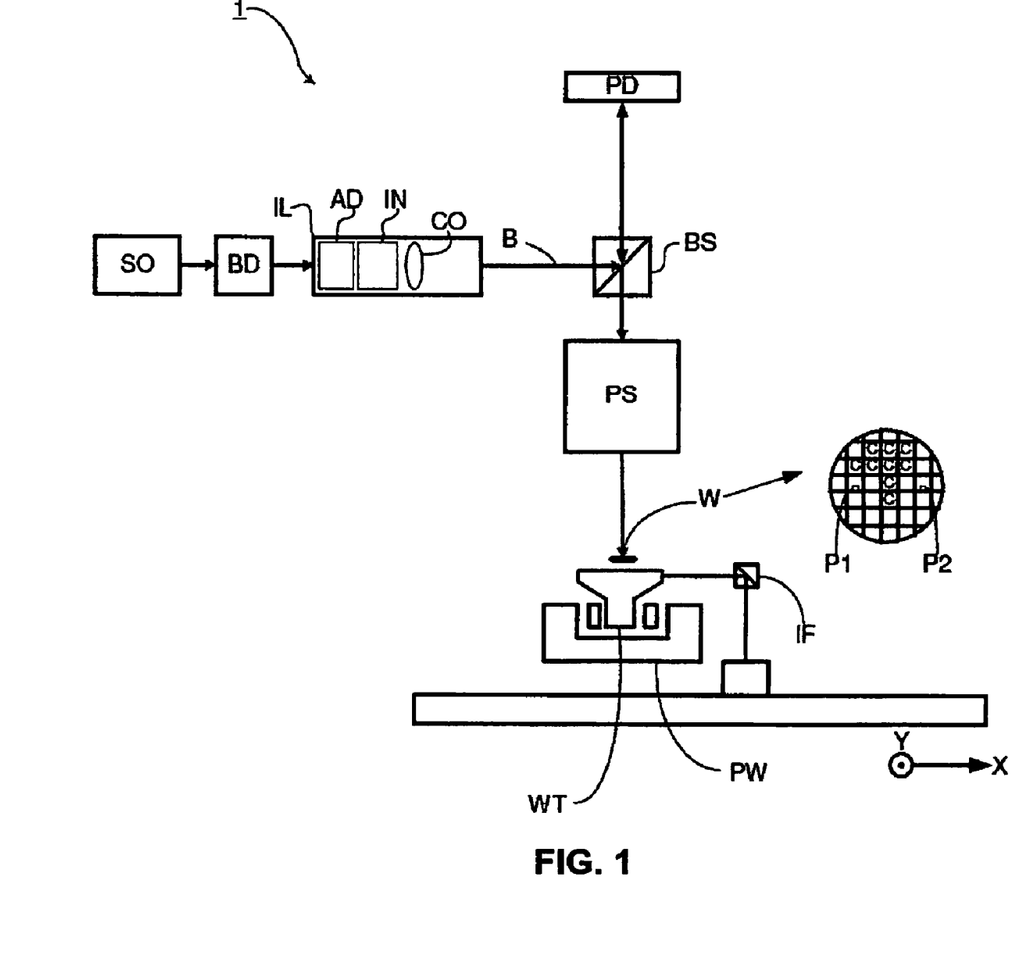
FIGS. 1 and 2 illustrate lithographic apparatus, according to various embodiments of the present invention.

FIG. 1 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer may be: a III/V compound semiconductor wafer, a silicon wafer, a ceramic substrate, a glass substrate, or a plastic substrate. The substrate may be transparent (for the naked human eye), colored, or absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. The thickness of the substrate may be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
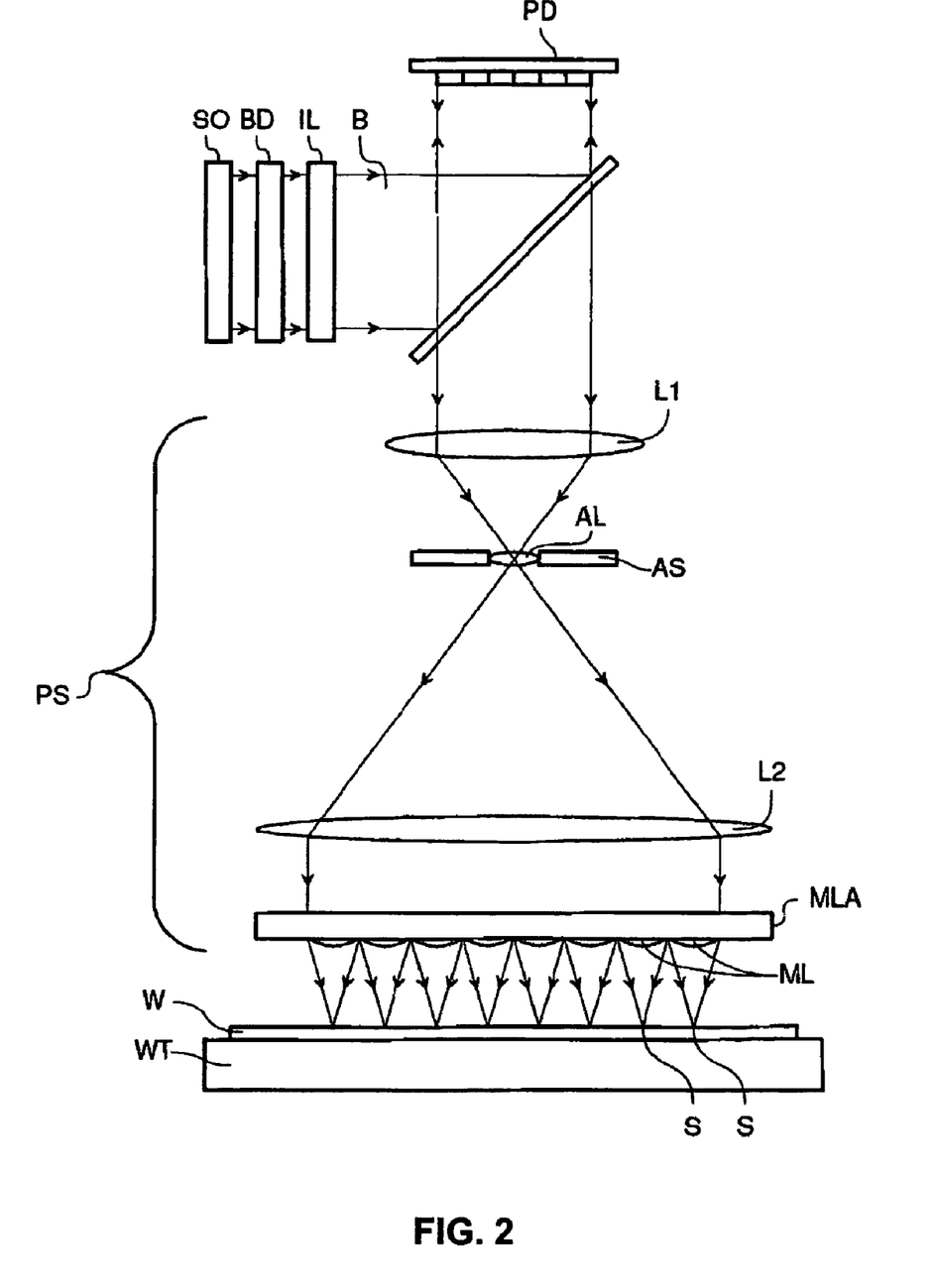

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 11-13 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
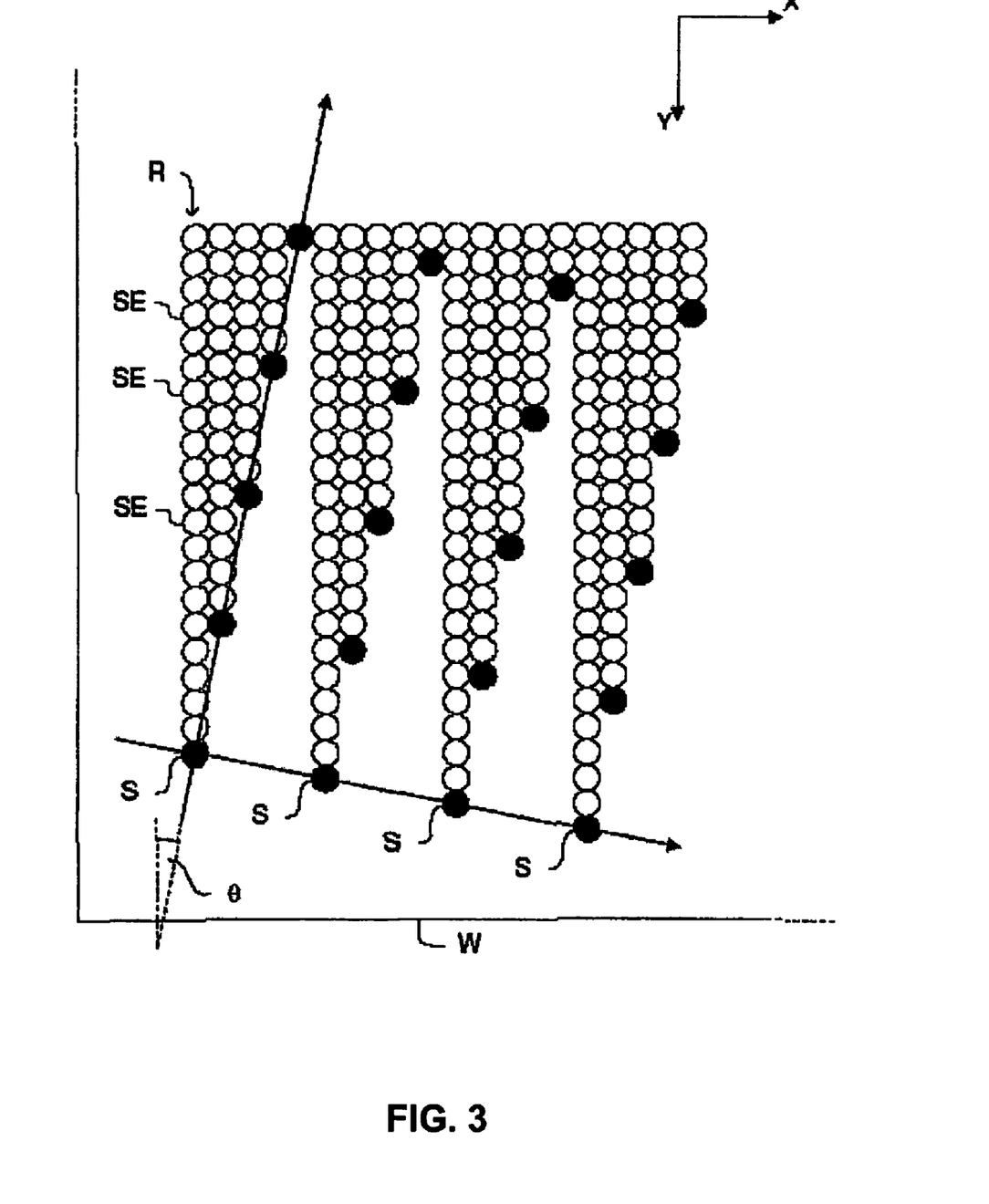
FIG. 3 illustrates a mode of transferring a pattern to a substrate according to one embodiment of the invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle $\theta$ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle $\theta$ is at most 20°, 10°, e.g., at most 5°, at most 3°, at most 1°, at most 0.5°, at most 0.25°, at most 0.10°, at most 0.05°, or at most 0.01°. In one example, the angle $\theta$ is at least 0.001°.

Figure 4:
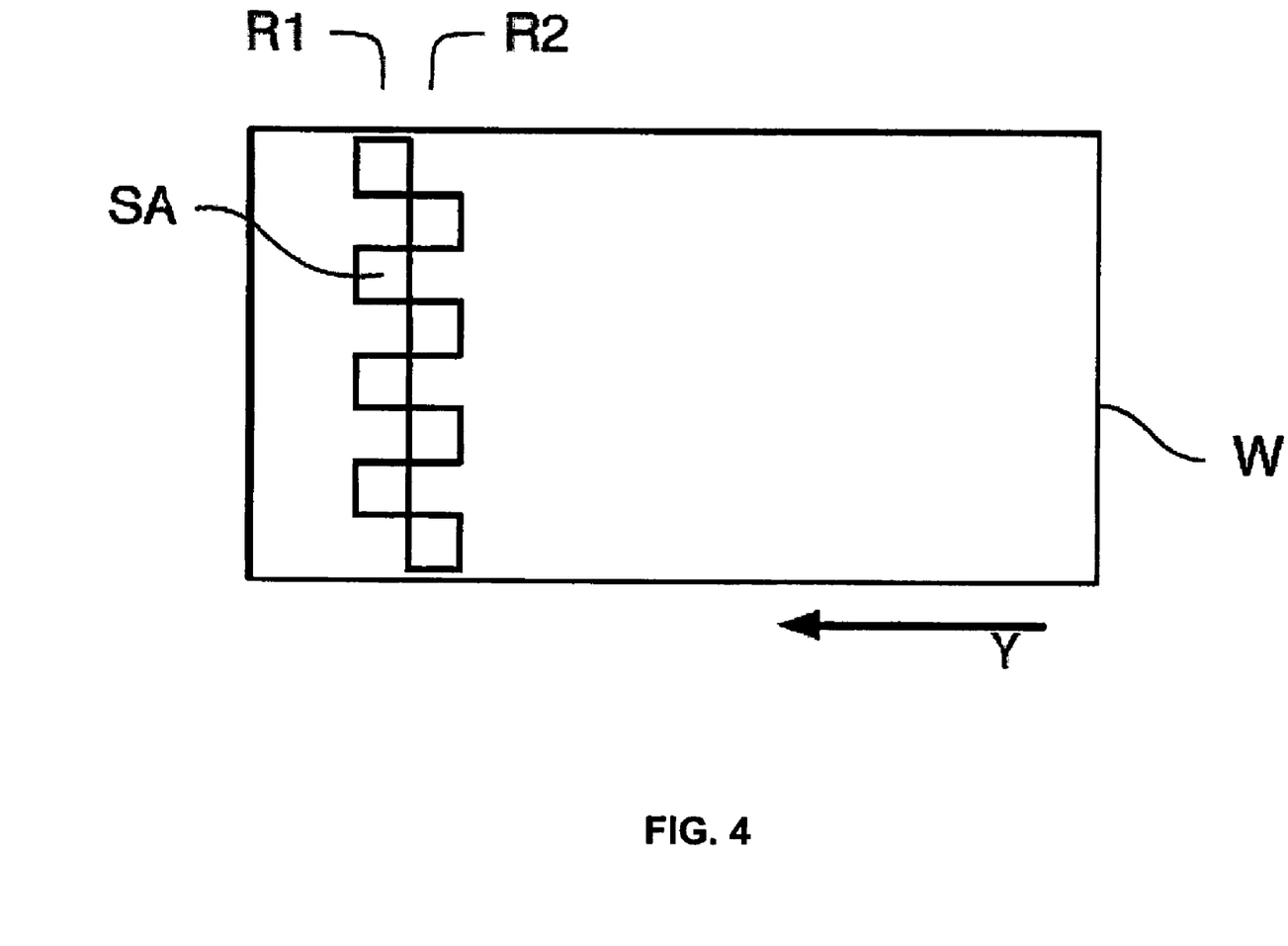
FIG. 4 illustrates an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

III. Exemplary Optical Zoom Assemblies

Figure 5:
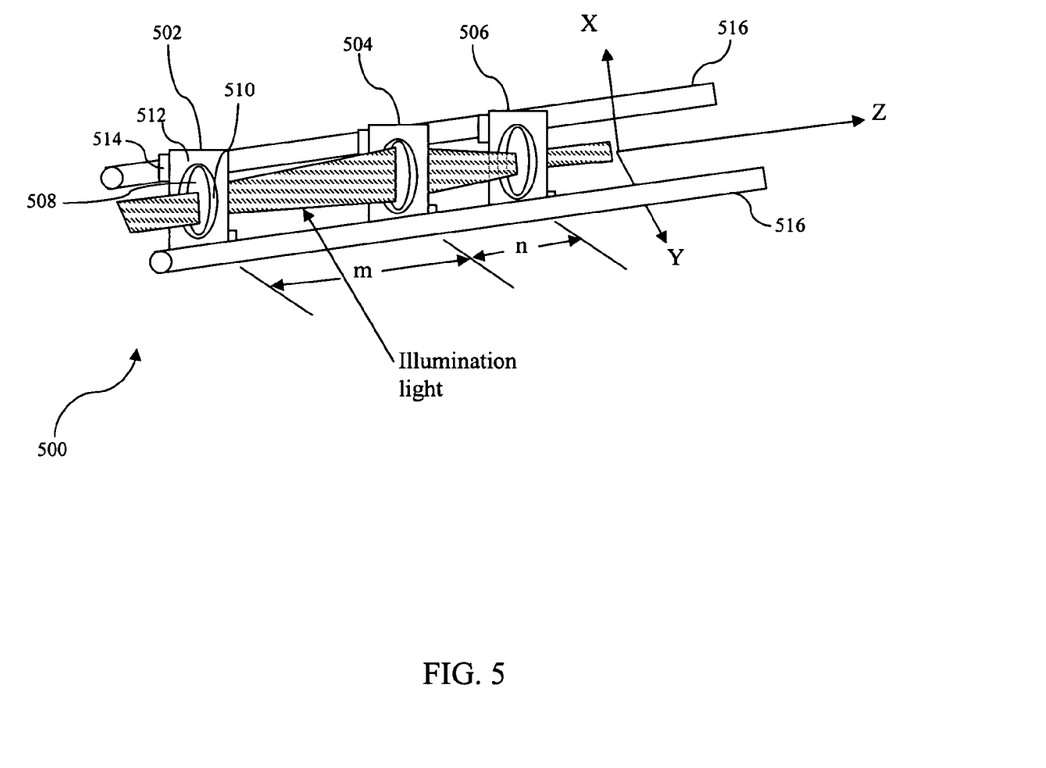
FIG. 5 illustrates an example optical zoom assembly.

FIG. 5 illustrates a current state-of-the-art optical zoom assembly 500. Zoom assembly 500 includes lens assemblies 502, 504, and 506. Each lens assembly includes a lens 508, a lens cell 510, and a lens mount 512. Lens 508 is attached at its perimeter to lens cell 510. Lens cell 510 is in turn attached to lens mount 512. In zoom assembly 500, each lens assembly is mounted on a flat mounting surface, such as mounting surface 514. Mounting surface 514 may be coupled to an actuator 516, such as an air bar, slide, roller-bearing, screw drive, or the like, so that the lens assembly can move along the length of actuator 516. The lenses can then be moved to actuate a desired zoom. If the surface of the actuator is not perfectly flat, the lens assembly may translate or rotate out of its plane (off-axis) as it changes position along the actuator. With traditional, mask-based systems, these off-axis movements do not affect the output beam, since the accuracy required for mask-based systems is typically tolerant of about 25 to 50 microns of off-axis movement.

For example, current systems allow an approximately 3 µm error for lens translation in the X and Y axes. Current systems also allow an approximately +/−12 arc-second error for lens rotation about the Z axis (e.g., Rz). The tolerances for optical maskless lithography ("OML") systems that use a programmable patterning device, however, are more strict. For example, OML typically requires an error of no more than 0.1 µm for lens translation in the X and Y axes, and +/−5 arc-second error for lens rotation. As can be seen, traditional mounting techniques with traditional tolerances are insufficient for sensitive OML systems. The problem is further complicated by a six-fold increase in the stroke (distance) requirement for the lens-to-lens displacement in an OML system.

Figure 6:
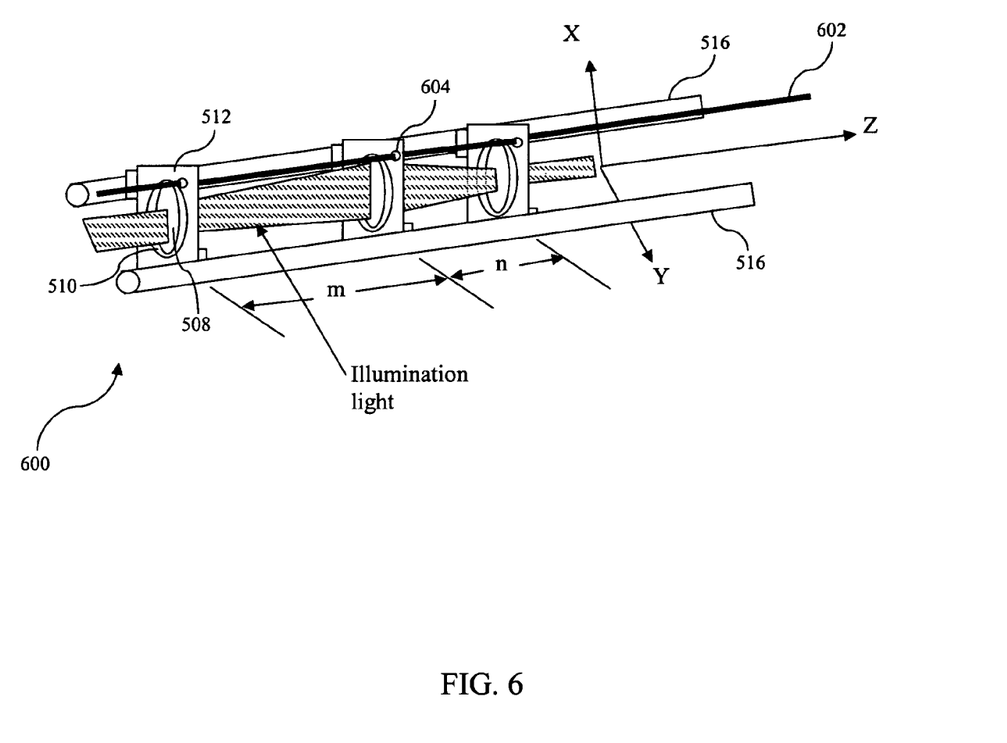
FIG. 6 illustrates an example optical zoom assembly having a virtual reference axis beam.

FIG. 6 illustrates an optical zoom assembly 600 according to an embodiment of the present invention. Assembly 600 allows an OML zoom to occur according to the requirements listed with respect to FIG. 5 by correcting the off-axis translation (including lens translation in the X and Y axes and lens rotation in the Rz axis) over an entire zoom range.

In assembly 600, one or more laser beams is used to provide a virtual reference axis 602 extending along the direction of in-axis travel (e.g., along the optical axis of the zoom lenses or Z axis). The direction of in-axis travel refers to the overall direction of motion of the lenses to be positioned during a zoom operation. Virtual reference beam 602 is projected along optical axis Z, parallel to existing mechanical lens slide actuators 516.

Figure 7:
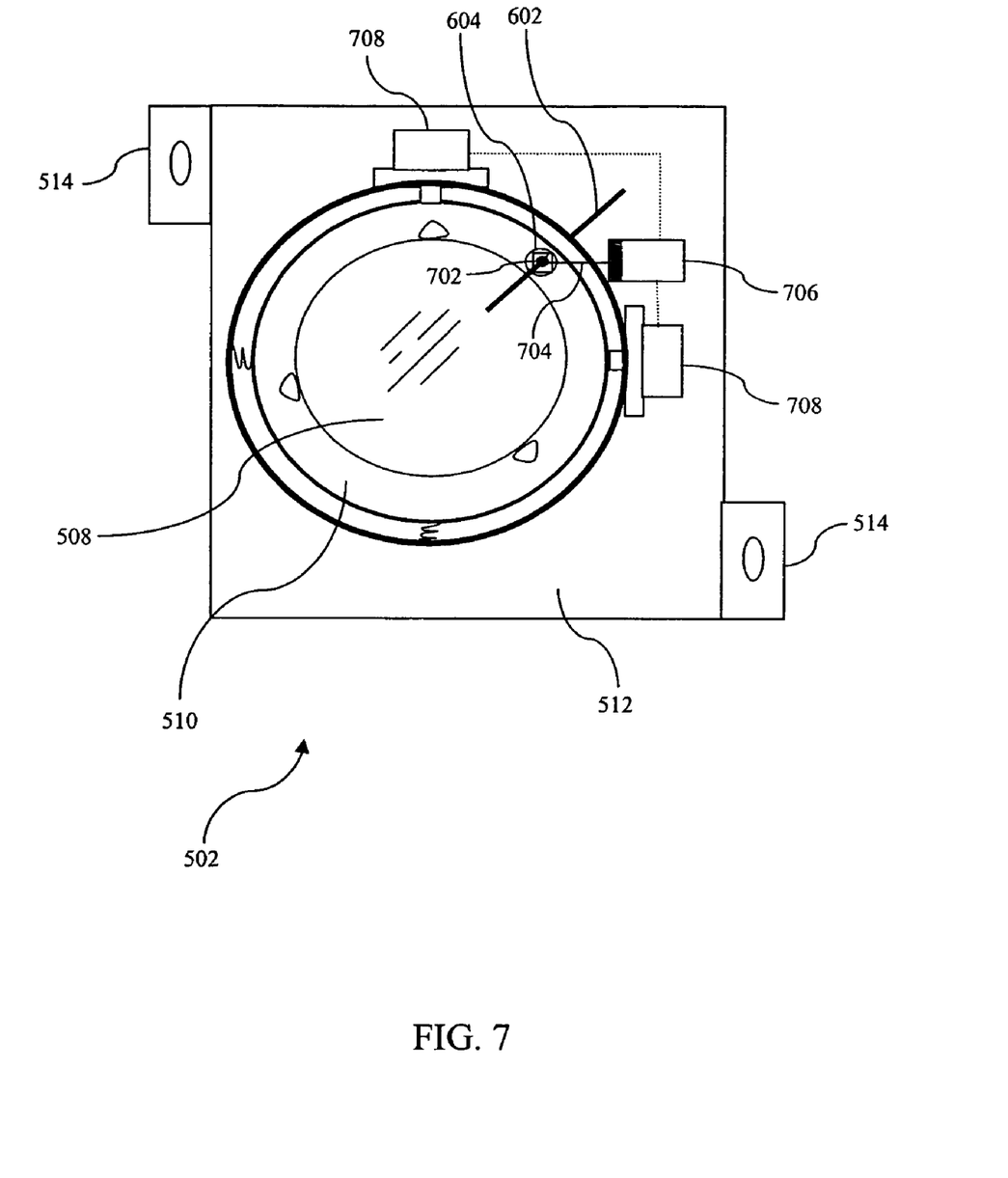
FIG. 7 illustrates an example lens and mount assembly for use in the example optical zoom assembly of FIG. 6.

Virtual reference axis 602 passes through an aperture 604 on each lens cell 510 on lens mount 512. FIG. 7 illustrates a representative lens assembly 502 from zoom assembly 500, modified according to an embodiment of the present invention. Lens cell 510 is movably attached to lens mount 512, such that lens cell 510 (and thus lens 508) may move in the X, Y, and Rz axes (only the X and Y axes are illustrated in FIG. 7). Virtual reference axis 602 passes through aperture 604 on lens cell 510. Laser light creating virtual reference axis 602 is sampled by beam sampling optic 702, creating a sampled beam 704. Sampled beam 704 is then sent to a detection system 706.

As lens assembly 502 moves along optical axis Z, off-axis motion in X, Y, and Rz may be detected by detection system 706. Detection system 706 responds to the off-axis motion by sending a feedback signal to one or more positioning motors 708 (e.g., servos). One or more positioning motors 708 then alter the position of lens cell 510 so as to re-align lens 508 with virtual reference axis 602, in a manner that would become apparent to a person having ordinary skill in the art.

Figure 8:
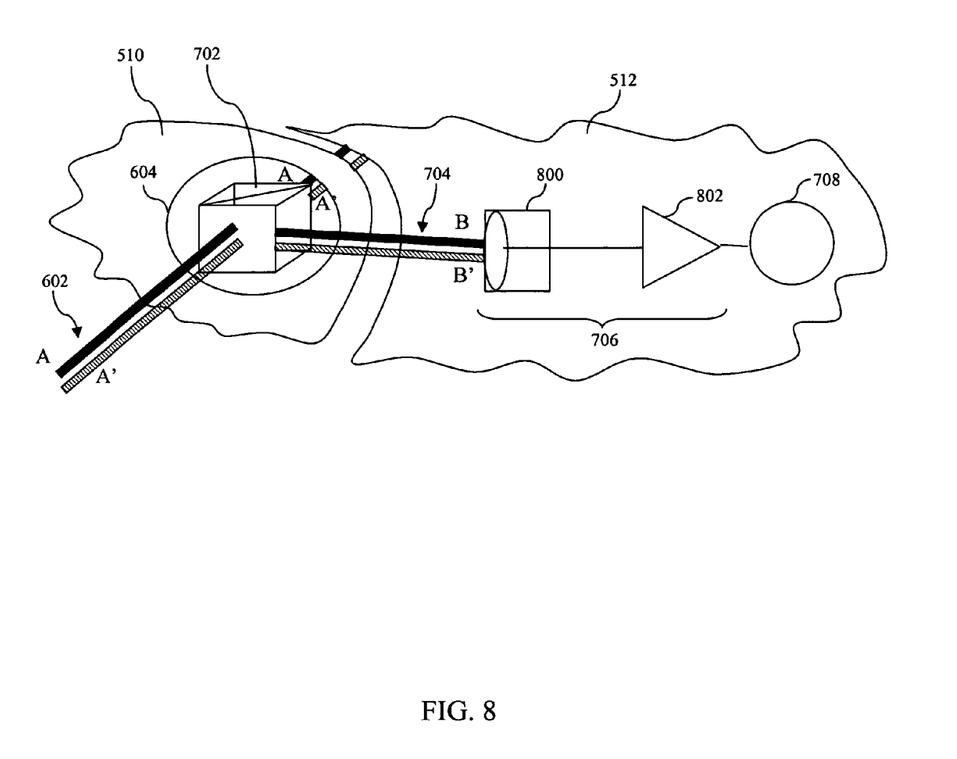
FIG. 8 illustrates an example detection system according to an embodiment of the present invention.

FIG. 8 illustrates an embodiment of aperture 604, sampling optic 702, and detection system 706 according to an embodiment of the present invention. Aperture 604 is located directly on lens cell 510, and sampling optic 702 is coupled to the structure of lens cell 510. In this embodiment, sampling optic 702 is a beam splitter. Detection system 706 can include a sensor 800 and an error amplifier 802. Sensor 800 can be mounted directly to lens mount 512. As described above, when lens mount 512 is moved along the Z axis to manipulate the zoom characteristics of an illumination beam, any off-axis motion of lens assembly 502 with respect to virtual reference axis 602 will appear as a translation of the laser light on sampling optic 702. In FIG. 8, the position of virtual reference axis 602 with respect to lens cell 510 prior to off-axis motion is referred to as beam A. Similarly, the position of virtual reference axis 602 with respect to lens cell 510 after off-axis motion occurs is referred to as translated beam A'.

Sampling optic 702 samples some of the energy from the laser beam creating virtual reference axis 602 to create sampled beam 704. The position of sampled beam 704 with respect to sampling optic 702 and sensor 706 also changes due to off-axis motion of lens assembly 502. Sample beam B corresponds to the position of sampled beam 704 when virtual reference axis 602 is positioned at beam A with respect to lens cell 510. Translated sample beam B' corresponds to the position of sampled beam 704 when virtual reference axis 602 is positioned at translated beam A' with respect to lens cell 510.

Sampled beam 704 is directed to detection system 706, which detects a difference in position between sample beam B and translated sample beam B' on sensor 800. The detected difference in position can then be input into error amplifier 802. Error amplifier 802 sends a feedback signal containing a corresponding correction to one or more positioning motors 708. One or more positioning motors 708 use the feedback signal to correct the position of lens cell 510 (and thus lens 508) relative to virtual reference axis 602.

Figure 9:
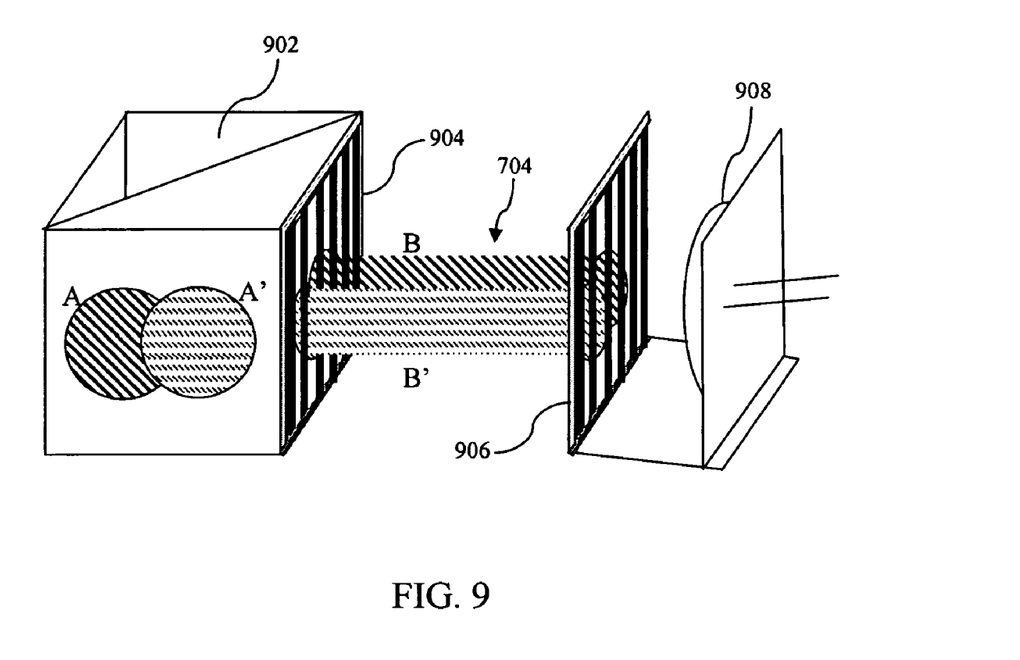
FIG. 9 illustrates an example detector for use with the detection system of FIG. 8.

FIG. 9 is an illustration of an example detection system that may be used to detect the translation of lens cell 510 with respect to virtual reference axis 602. In this embodiment, sampling optic 702 is a beam splitter 902 coupled to a grating 904. A second grating 906 is coupled to a light intensity sensor 908. Gratings 904 and 906 have identical pitch and are aligned. Each of aligned gratings 904 and 906 can be, for example and without limitation, simple chrome gratings with a clear reticle and a transmission of approximately 50%.

Figure 10:
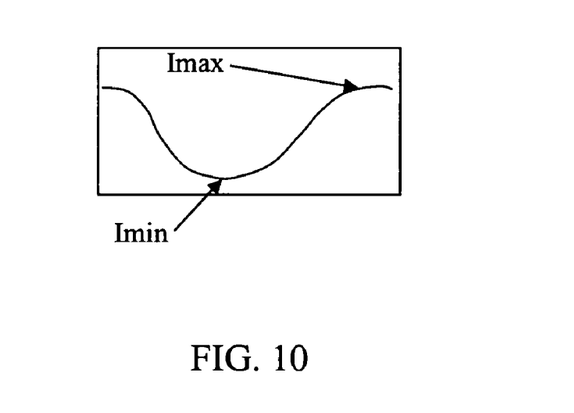
FIG. 10 illustrates an example output of the detector of FIG. 9.

During a zoom setting change, as light from virtual reference axis 602 interacts with beam splitter 902 and translates position from A to A' due to lens motion, the output of beam splitter 902 will translate position from B to B'. Gratings 904 and 906 cause the light incident on sensor 908 to change from minimum intensity to maximum intensity in a sinusoidal fashion, as illustrated in FIG. 10. The intensity change detected by sensor 908 is directly correlated to the amount of the off-axis motion of lens cell 510 (and thus lens 508) to virtual reference axis 602.

The pitch of gratings 904 and 906 can be designed to keep the entire expected range of translation to a single period, thus simplifying the detection electronics. Using readily available components and simple cosine fit functions, motion detection of 1 part in 1000 is attainable. Thus, for off-axis motions caused by 100 microns of non-flatness of lens slide actuator 516 (an order of magnitude worse than the state-of-the-art air bars or slides currently available), 0.1 µm of positioning accuracy would be attainable.

Figure 11:
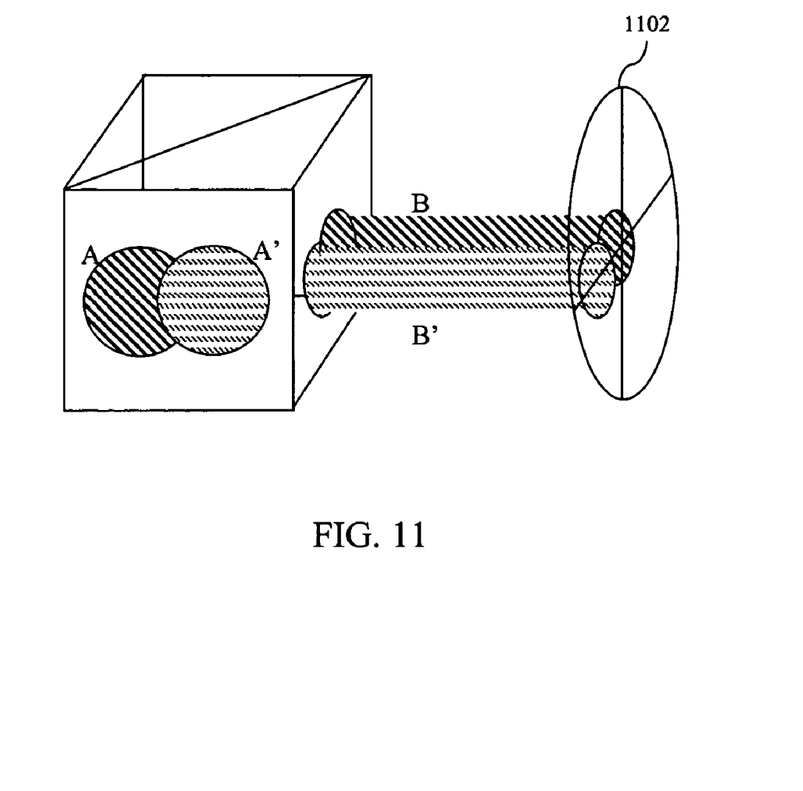
FIG. 11 illustrates another example detector for use with the detection system of FIG. 8.

Although a grating detection system is illustrated in FIG. 9, one of skill in the art will recognize that other types of detectors can be used to detect translation of sampled beam 704 from position B to position B' as the lens assembly moves. FIG. 11 illustrates another example detector that may be used. Instead of a grating-based detection system, the embodiment of FIG. 11 uses a quad cell detector 1102. Quad cell detector 1102 includes four or more individual detectors arranged around a center point (similar to pie pieces). When representative lens assembly 502 is aligned with virtual reference beam 602, the amount light detected by each of the individual detectors (as evidence by, for example, a voltage) is equal (B). As lens assembly 502 moves, causing sampled beam 704 to move relative to the detectors, the amount of light detected by each detector changes (B'). Actuators can then be used to reposition lens cell 510 so that the amount of light detected by each detector returns to equal (B).

Figure 12:
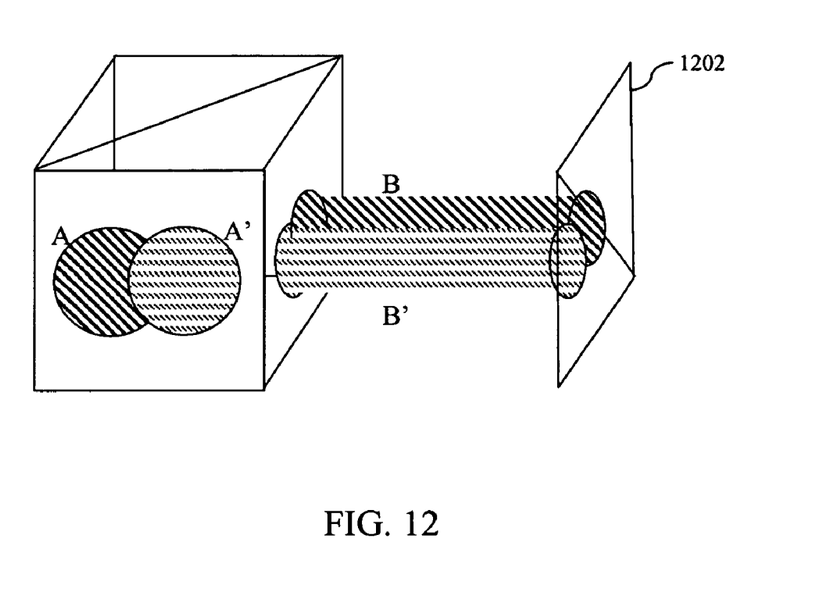
FIG. 12 illustrates yet another example detector for use with the detection system of FIG. 8.

FIG. 12 illustrates another example detector that can be used. The embodiment of FIG. 12 uses a double triangle detector 1202. Double triangle detector 1202 is shaped like a rectangular detector but is bisected into two triangles. When lens assembly 502 is correctly aligned with virtual reference beam 602, sampled beam 704 at position B can be centered between the two triangles. As sampled beam 704 moves to position B', the change in the voltage between the two triangle detectors can be detected and corrected.

Beam sampling optic 702 and detector 704 are arranged such that any off-axis change in the position of lens cell 510 relative to virtual reference axis 602 is sensed and corrected. Since the same virtual reference axis 602 is used for each lens assembly in zoom assembly 500, each lens assembly can be independently corrected for off-axis position errors to very high precision.

This arrangement can also be used to eliminate manufacturing variability inherent in the lens elements, cell and mount hardware, as well as the lens slides. During set up, the initial alignment and cell offset determination can be accomplished by analysis of the end-to-end aberration set of the zoom optics, and offsets due to electronics, manufacturing variability, and drifts can be corrected.

IV. Conclusion

Although specific reference was made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g., a thin film transistor layer and/or a color filter layer.

Additionally, the virtual reference axis used to align lens elements in an optical zoom assembly as described herein provides an extremely high precision reference for measuring and correcting off-axis errors. While this alignment system has the potential to improve the position accuracy of optical device mountings by two orders of magnitude or more over conventional methodologies, one of skill in the art will recognize that such an alignment technique may be used for aligning any type of object. For instance, this approach can be used in any application where high-precision, relative motion between two or more components (not necessarily optical components) is required.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way.

What is claimed is:

1. A system for correcting off-axis translation of an element aligned on an axis of alignment, comprising:
   a laser configured to generate a virtual reference axis beam parallel to the axis of alignment;
   a beam splitter located on the element and configured to indicate a position of the element with respect to the virtual reference axis beam;
   a detector in communication with the beam splitter and configured to detect changes in the position of the element with respect to the virtual reference axis beam as indicated by the beam splitter, wherein the detector comprises,
      a light sensor,
      a first grating coupled to the beam splitter, and
      a second grating coupled to the light sensor; and
   a positioner configured to align the element with the virtual reference axis beam based on position changes detected by the detector.

2. The system of claim 1, wherein the light sensor is a light intensity sensor.

3. The system of claim 1, further comprising an error amplifier configured to generate a feedback signal based on position changes detected by the detector, wherein the positioner is configured to align the element with the virtual reference axis beam based on the feedback signal.

4. An optical zoom assembly having a zoom axis, comprising:
   a lens assembly configured to be moved along the zoom axis;
   a lens slide configured to actuate movement of the lens assembly along the zoom axis; and
   a laser configured to provide a virtual reference axis beam parallel to the zoom axis,
   wherein the lens assembly comprises:
      a lens cell;
      a detector configured to detect changes in a position of the lens cell with respect to the virtual reference axis beam; and
      a positioner configured to align the lens cell with the virtual reference axis beam when changes in the position of the lens cell are detected by the detector.

5. The optical zoom assembly of claim 4, further comprising:
   a second lens assembly configured to move along the zoom axis, wherein the second lens assembly comprises:
      a second lens cell having a second detector configured to detect changes in a position of the second lens cell with respect to the virtual reference axis beam; and
      a second positioner configured to align the second lens cell with the virtual reference axis beam when changes in the position of the second lens cell are detected by the second detector.

6. The optical zoom assembly of claim 4, wherein the detector comprises:
   a beam sampling device located on the lens cell and configured to indicate a position of the lens cell with respect to the virtual reference axis beam;
   a sensor configured to detect changes in the position of the lens cell with respect to the virtual reference axis beam as indicated by the beam sampling device; and
   an error amplifier configured to generate a feedback signal based on position changes detected by the sensor, wherein the positioner is configured to align the lens cell with the virtual reference axis beam based on the feedback signal.

7. The optical zoom assembly of claim 6, wherein the beam sampling device is a beam splitter.

8. The optical zoom assembly of claim 7, wherein the sensor comprises:
   a light sensor;
   a first grating coupled to the beam splitter; and
   a second grating coupled to the light sensor.

9. The optical zoom assembly of claim 8, wherein the light sensor is a light intensity sensor.

10. The optical zoom assembly of claim 4, wherein the detector is a quad cell detector.

11. The optical zoom assembly of claim 4, wherein the detector is a double triangle detector.

12. A method of correcting off-axis translation of an element aligned on an axis of alignment, comprising:
   generating a virtual reference axis beam parallel to the axis of alignment;
   detecting changes in a position of the element with respect to the virtual reference axis beam wherein the detecting step comprises,
      determining a correct alignment position of the element with respect to the virtual reference axis beam,
      moving the element along the axis of alignment, and
      determining a second position of the element with respect to the virtual reference axis beam; and
   aligning the element with the virtual reference axis beam based on the detected changes in the position of the element, wherein the aligning step comprises returning the element to the correct alignment position.

13. The method of claim 12, wherein:
   the detecting step further comprises:
      sampling the virtual reference axis beam to determine position of the element with respect to the virtual reference axis beam;
      determining a change in position of the element based on changes in the sampled virtual reference axis beam; and
      generating a feedback signal to correct the change in position of the element, and
   the aligning step comprises aligning the element based on the feedback signal.

14. The method of claim 12, wherein the detecting step further comprises detecting a change in intensity of the virtual reference axis beam.

15. The method of claim 12, further comprising:
   detecting changes in a position of a second element with respect to the virtual reference axis beam; and
   aligning the second element with the virtual reference axis beam based on the detected changes in the position of the second element.

16. An optical assembly having an optical axis of alignment, comprising:
   a first assembly configured to be moved along the optical axis of alignment, wherein the first assembly comprises:
      an optical element configured to be positioned by an in-axis direction of motion of the first assembly in the optical assembly;
      a beam splitter located on the optical element and configured to indicate a position of the optical element with respect to a virtual reference axis beam being parallel to the optical axis of alignment;

a detector located on the optical element and configured to detect changes in the position of the optical element with respect to the virtual reference axis beam; and a positioner located on the optical element and configured to align the optical element with the virtual reference axis beam when changes in the position of the optical element are detected by the detector for correcting an off-axis position error of the optical element aligned on the optical axis of alignment.

17. The optical assembly of claim 16, wherein the optical element is configured to be positioned during a zoom operation.

18. The optical assembly of claim 16, wherein the optical element of the first assembly includes a first lens of an optical zoom assembly for use in a lithographic apparatus.

19. The optical assembly of claim 18, further comprising:
a second assembly including a second lens of the optical zoom assembly for use in the lithographic apparatus such as an optical maskless lithography system.

20. The optical assembly of claim 19, further comprising:
a laser configured to provide the virtual reference axis beam parallel to the optical axis of alignment; and
a lens slide configured to actuate movement of the optical zoom assembly along the optical axis of alignment such that off-axis translation of first and second lenses aligned on the optical axis of alignment are independently corrected.

21. A method of correcting off-axis translation of an optical element aligned on an optical axis of alignment, comprising:
indicating a position of the optical element with respect to a virtual reference axis beam being parallel to the optical axis of alignment such that the optical element is configured to be moved along the optical axis of alignment for a desired positioning by an in-axis direction of motion of the optical element in an optical assembly;
detecting changes in the position of the optical element with respect to the virtual reference axis beam; and
aligning the optical element with the virtual reference axis beam when changes in the position of the optical element are detected for correcting an off-axis position error of the optical element.

22. The method of claim 21, further comprising:
generating the virtual reference axis beam parallel to the optical axis of alignment;
detecting the changes in the position of the optical element by determining a correct alignment position of the optical element with respect to the virtual reference axis beam, moving the optical element along the optical axis of alignment, and determining a second position of the optical element with respect to the virtual reference axis beam; and
aligning the optical element with the virtual reference axis beam based on the detected changes in the position of the optical element by returning the optical element to the correct alignment position.

* * * * *